US008735982B2

(12) United States Patent
Onishi

(10) Patent No.: US 8,735,982 B2
(45) Date of Patent: May 27, 2014

(54) SEMICONDUCTOR DEVICE WITH SUPERJUNCTION STRUCTURE

(75) Inventor: Yasuhiko Onishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 231 days.

(21) Appl. No.: 13/290,508

(22) Filed: Nov. 7, 2011

(65) Prior Publication Data

US 2012/0112306 A1 May 10, 2012

(30) Foreign Application Priority Data

Nov. 9, 2010 (JP) ................................. 2010-250427

(51) Int. Cl.
*H01L 29/66* (2006.01)

(52) U.S. Cl.
USPC ........... 257/342; 257/401; 257/409; 257/488; 257/E29.257

(58) Field of Classification Search
USPC ....................................................... 257/342
See application file for complete search history.

(56) References Cited

U.S. PATENT DOCUMENTS

| | | | | | |
|---|---|---|---|---|---|
| 5,545,915 | A | * | 8/1996 | Disney et al. | 257/491 |
| 7,042,046 | B2 | * | 5/2006 | Onishi et al. | 257/328 |
| 2001/0028083 | A1 | | 10/2001 | Onishi et al. | |
| 2003/0176031 | A1 | | 9/2003 | Onishi et al. | |
| 2004/0065921 | A1 | * | 4/2004 | Iwamoto et al. | 257/341 |
| 2005/0098826 | A1 | * | 5/2005 | Yamaguchi et al. | 257/341 |
| 2005/0184336 | A1 | | 8/2005 | Takahashi et al. | |
| 2006/0033153 | A1 | | 2/2006 | Onishi et al. | |
| 2007/0001230 | A1 | * | 1/2007 | Lee et al. | 257/367 |
| 2008/0185643 | A1 | * | 8/2008 | Hossain | 257/342 |
| 2011/0204442 | A1 | * | 8/2011 | Guan et al. | 257/342 |

FOREIGN PATENT DOCUMENTS

| | | |
|---|---|---|
| JP | 2001298190 A | 10/2001 |
| JP | 2003115589 A | 4/2003 |
| JP | 2003204065 A | 7/2003 |
| JP | 2003224273 A | 8/2003 |
| JP | 2003-273355 A | 9/2003 |
| JP | 2004072068 A | 3/2004 |
| JP | 2005203565 A | 7/2005 |
| JP | 2005260199 A | 9/2005 |
| JP | 2006073987 A | 3/2006 |
| JP | 2006186108 A | 7/2006 |
| JP | 2007-266505 A | 10/2007 |

OTHER PUBLICATIONS

Japanese Office Action for corresponding JP 2010-250427, mail dated Feb. 4, 2014. Partial translation provided.

* cited by examiner

*Primary Examiner* — Stephen W Smoot
(74) *Attorney, Agent, or Firm* — Rossi, Kimms & McDowell LLP

(57) ABSTRACT

A superjunction semiconductor device is disclosed which has, in the active section, a first alternating-conductivity-type layer which makes a current flow in the ON-state of the device and sustains a bias voltage in the OFF-state of the device. There is a second alternating-conductivity-type layer in a edge-termination section surrounding the active section. The width of a region of a second conductivity type in the second alternating-conductivity-type layer becomes narrower at a predetermined rate from the edge on the active section side toward the edge of the edge termination section. The superjunction semiconductor device facilitates manufacturing the edge-termination section which exhibits a high breakdown voltage and a high reliability for breakdown voltage through a process that exhibits a high mass-productivity.

4 Claims, 6 Drawing Sheets

SEMICONDUCTOR DEVICE WITH SUPERJUNCTION STRUCTURE

BACKGROUND OF THE INVENTION

A. Field of the Invention

The present invention relates to semiconductor devices having a superjunction structure, exhibiting a high breakdown voltage and a high current capability, and applicable to MOS-type field-effect transistors (hereinafter referred to as "MOSFET's"), insulated-gate bipolar transistors (hereinafter referred to as "IGBT's"), and bipolar transistors. Hereinafter, the semiconductor devices having a superjunction structure will be referred to sometimes as the "superjunction semiconductor devices."

B. Description of the Related Art

In the following descriptions, a superjunction semiconductor device is a semiconductor device that includes an alternating-conductivity-type layer including a column-shaped or layer-shaped p-type region and a column-shaped or layer-shaped n-type region adjoining each other repeatedly in parallel to the major surface of the semiconductor substrate. In other words, the alternating-conductivity-type layer is a drift layer that includes pn-junctions extending in perpendicular to the major surface of the semiconductor substrate. The drift layer that includes an alternating-conductivity-type layer makes a current flow in the ON-state of the device and sustains a bias voltage in the OFF-state of the device.

Generally, the semiconductor devices may be classified into a lateral semiconductor device and a vertical semiconductor device. In the lateral semiconductor device, the electrodes are formed on one major surface of a semiconductor substrate and a main current flows along the major surface. In the vertical semiconductor device, the electrodes thereof are distributed onto the major surfaces of a semiconductor substrate and a main current flows between the electrodes on the major surfaces.

In the vertical semiconductor device, the direction of a drift current flowing in the ON-state of the device is the same as the direction of a depletion layer expansion by a bias voltage in the OFF-state of the device. For example, the high resistivity n⁻ drift layer in the usual planar-type n-channel vertical MOSFET works as a region that makes a drift current flow vertically in the ON-state of the MOSFET and is depleted to sustain a bias voltage in the OFF-state of the MOSFET.

If the current path in the high resistivity n⁻ drift layer is short, the drift resistance will be low in the ON-state of the MOSFET. Therefore, the short current path is effective to lower the substantial ON-state resistance of the MOSFET. However, if the current path in the high resistivity n⁻ drift layer is short, the width, for which the depletion layer extending from the pn-junction between the p-type base region and the n⁻ drift layer expands in the OFF-state of the MOSFET, will be narrow, causing a low breakdown voltage. In order to obtain a semiconductor device with a high breakdown voltage, the n⁻ drift layer should be thick. A thick n⁻ drift layer causes high on-resistance and loss increase inevitably. In other words, there exists a tradeoff relationship between the on-resistance and the breakdown voltage. It is well known that the tradeoff relationship holds in the semiconductor devices such as IGBT's, bipolar transistors and diodes. The tradeoff relationship also holds commonly in the lateral semiconductor devices where the direction of the drift current flowing is different from the direction of the depletion layer expansion.

One way of solving the tradeoff relationship issue is to increase the impurity concentrations in the drift layer and to provide the drift layer with a superjunction structure that includes an alternating-conductivity-type layer including a n-type semiconductor region and a p-type semiconductor region arranged alternately. The superjunction semiconductor device forms the drift layer thereof of the alternating-conductivity-type layer described above to reduce the on-resistance and to deplete the drift layer quickly in the OFF-state further to make the depleted drift layer sustain a bias voltage. Therefore, the superjunction semiconductor device facilitates improving the tradeoff relationship described above.

The superjunction semiconductor device is different from the usual planar-type n-channel vertical MOSFET in that the drift layer in the superjunction semiconductor device is not a uniform layer of one conductivity-type but rather an alternating-conductivity-type layer including a column-shaped or layer-shaped n-type drift region and a column-shaped or layer-shaped p-type partition region adjoining each other repeatedly in parallel to the major surface of the semiconductor substrate to form a pn-junction therebetween and to extend the pn-junctions in perpendicular to the major surface of the semiconductor substrate. The impurity concentrations in the drift layer including n-type drift regions and p-type partition regions are set to be higher than the impurity concentration in the drift region in the usual vertical MOSFET exhibiting an almost equivalent breakdown voltage. The widths of the n-type drift region and p-type partition region are controlled to be narrow enough so that they are depleted by a lower bias voltage.

To provide a semiconductor device with a high breakdown voltage, it is necessary to form an edge-termination section that surrounds circularly the active section, in which the main current flows. If the edge termination section is not formed, the breakdown voltage will be low due to a high electric field in the edge area of the drift layer and it will be difficult to obtain a high breakdown voltage. Moreover, even if an initial high breakdown voltage is maintained by the provision of the edge termination section, it will be difficult for a semiconductor device that exhibits low robustness against induced charges to guarantee a long-term reliability for the breakdown voltage.

In a semiconductor device that exhibits low robustness against surface charges, the space charges induced onto the insulator film surface on the edge termination section affect the depletion layer expansion adversely and lower the breakdown voltage with the passage of time. In the following descriptions, the semiconductor device that exhibits high or excellent robustness against induced charges is a semiconductor device that facilitates suppressing the adverse effects of the charges, induced from the outside onto the insulator film surface on the edge termination section, on the depletion layer expansion in the edge termination section and keeping the initial breakdown voltage even after the passage of a predetermined operating time. In other words, the semiconductor device that exhibits high or excellent robustness against induced charges is a semiconductor device that exhibits a high reliability for breakdown voltage.

As a semiconductor device that improves the reliability for breakdown voltage thereof, a semiconductor device that includes guard rings in the edge termination section is known. In the semiconductor device, the guard rings are connected electrically to the electrically conductive field plates connected in the forward and reverse voltage directions. Even if positive and negative charges exist on the edge termination section, the semiconductor device that includes the edge termination section as described above will weaken the adverse effects of the positive and negative charges on the depletion layer expansion in the vicinity of the device surface. As a result, the breakdown voltage is prevented from varying and the robustness against induced charges is improved.

Japanese Unexamined Patent Application Publication No. 2003-204065 (Paragraph 0038) describes a superjunction semiconductor device which includes, in the edge termination section, a field plate on an alternating-conductivity-type layer and a guard ring in the surface portion of the alternating-conductivity-type layer. Japanese Unexamined Patent Application Publication No. 2005-203565 (Paragraph 0013) describes a superjunction semiconductor device which includes a field plate on the alternating-conductivity-type layer in the edge termination section. The superjunction semiconductor device disclosed in these two documents exhibit a high breakdown voltage.

Japanese Unexamined Patent Application Publication No. 2003-224273 (Abstract) describes a first superjunction semiconductor device as described below. In the edge termination section around the first alternating-conductivity-type layer in the active section, the pitch and impurity concentrations in the second alternating-conductivity-type layer are set to be the same as the pitch and impurity concentrations in the first alternating-conductivity-type layer in the active section. Lightly doped p- and n-type regions are formed in the surface portions of the respective p- and n-type regions in the second alternating-conductivity-type layer in the edge termination section.

In a second superjunction semiconductor device disclosed in Japanese Unexamined Patent Application Publication No. 2003-224273, a third alternating-conductivity-type layer is formed on the second alternating-conductivity-type layer in the edge termination section. The direction of the alternating arrangement of the lightly doped p- and n-type regions in the third alternating-conductivity-type layer is perpendicular to the direction of the alternating arrangement of the p- and n-type regions in the second alternating-conductivity-type layer and heavily doped p-type regions are formed in the surface portion of the third alternating-conductivity-type layer.

Japanese Unexamined Patent Application Publication No. 2003-115589 (Abstract) describes a superjunction semiconductor device as described below. In the edge termination section around the first alternating-conductivity-type layer in the active section, the pitch and impurity concentrations in the second alternating-conductivity-type layer are set to be the same as the pitch and impurity concentrations in the first alternating-conductivity-type layer in the active section. A lightly doped n-type region is formed in the surface portion of the second alternating-conductivity-type layer and heavily doped p-type regions are formed in the surface portion of the lightly doped n-type region.

The structures described above relax the surface electric field in the edge termination section in the vicinity of the active section and hold a high breakdown voltage. Although the designed breakdown voltage is maintained initially, the breakdown voltage will lower gradually sometimes, if positive charges (positive ions) are induced on the edge termination section in the superjunction semiconductor devices disclosed in these latter two documents due to the reason described below.

Next, a device that includes a lightly doped alternating-conductivity-type layer arranged in the surface portion of the edge termination section is considered. Since a depletion layer expands easily in the surface of the alternating-conductivity-type layer and the electric field is relaxed, it is possible to obtain a higher breakdown voltage. However, as positively-charged ions are induced on the insulator film in the edge termination section, the depletion layer tends to hardly expand gradually, the electric field becomes higher around the field plate edge and the breakdown voltage lowers with passage of time. Therefore, it is considered that robustness against induced charges has not been taken yet.

Moreover, for holding the breakdown voltage characteristics, it is necessary for the superjunction semiconductor device disclosed in Japanese Unexamined Patent Application Publication No. 2003-115589 to form a uniform lightly-doped n-type surface region straddling the alternating-conductivity-type layer. Due to the additional steps for forming the n-type surface region, the manufacturing costs of the superjunction semiconductor device increase. It is necessary to dope the n-type surface region more lightly than the n-type drift region in the active section. However, it is difficult to controllably dope the n-type surface region more lightly than the n-type drift region in the active section.

In view of the foregoing, it would be desirable to solve the issues described above. It would be also desirable to provide a superjunction semiconductor device that facilitates manufacturing the edge termination section thereof exhibiting a high breakdown voltage and a high reliability for breakdown voltage through a process that exhibits a high mass-productivity. The present invention is directed to overcoming or at least reducing the effects of one or more of the problems set forth above.

SUMMARY OF THE INVENTION

According to an aspect of the invention, there is provided a semiconductor device including:
a heavily doped semiconductor substrate of a first conductivity type;
a first alternating-conductivity-type layer including a column-shaped or a layer-shaped first semiconductor region of the first conductivity type and a column-shaped or a layer-shaped second semiconductor region of a second conductivity type, the first and second semiconductor regions adjoining to each other repeatedly in parallel to the semiconductor substrate surface for forming a pn-junction therebetween, the pn-junctions extending in perpendicular to the semiconductor substrate surface;
the first alternating-conductivity-type layer working as a drift layer that makes a current flow in the ON-state of the semiconductor device and sustains a voltage in the OFF-state of the semiconductor device;
a surface structure on the surface side of the first alternating-conductivity-type layer, the surface structure constituting an active section that makes the current flow;
an edge-termination section surrounding the active section;
a second alternating-conductivity-type layer in the edge-termination section, the second alternating-conductivity-type layer including a column-shaped fourth semiconductor region of the second conductivity type in the third semiconductor region of the first conductivity type, the third and fourth semiconductor regions adjoining to each other repeatedly in parallel to the semiconductor substrate surface for forming a pn-junction therebetween, the pn-junctions extending in perpendicular to the semiconductor substrate surface; and
the width of the fourth semiconductor region in the second alternating-conductivity-type layer becoming narrower at a predetermined rate from the edge of active section side toward the edge of the edge termination section.

Advantageously, the semiconductor device further includes a guard ring, the guard rings being in the surface portion of the second alternating-conductivity-type layer, and the guard rings are spaced apart from each other.

Advantageously, the semiconductor device further includes an electrically conductive field plate on the guard ring, and the field plate is in electrical contact with the guard ring.

In the semiconductor device according to the invention, the width of the semiconductor region of the second conductivity type in the semiconductor region of the first conductivity type of the edge-termination section arranged in the grid pattern is made to be narrower gradually from the active section side toward the edge of the edge termination section. The structure described above facilitates expanding the depletion layer due to the positive charges induced onto the insulator film in the edge-termination section and preventing the depletion layer from expanding due to the negative charges induced onto the insulator film in the edge-termination section. Therefore, the robustness against induced charges is improved. By narrowing the p-type semiconductor region width in the edge-termination section at a predetermined rate toward the periphery of the device, the depletion layer expansion due to induced charges is controlled easily and the robustness against induced charges is improved.

According to the invention, a semiconductor device that includes an edge-termination section exhibiting a high breakdown voltage and a high reliability for breakdown voltage is manufactured with a high mass-productivity.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

The invention will be described in detail hereinafter with reference to the accompanied drawings which illustrate the preferred embodiments of the invention. Although the invention will be described in connection with the preferred embodiments thereof, changes and modifications are obvious to the persons skilled in art without departing from the true spirits of the invention. Therefore, the invention should be understood not by the specific descriptions herein but by the appended Claims thereof.

First Embodiment

The superjunction semiconductor device according to a first embodiment of the invention will be described below with reference to FIGS. 1 through 3.

Figure 1:
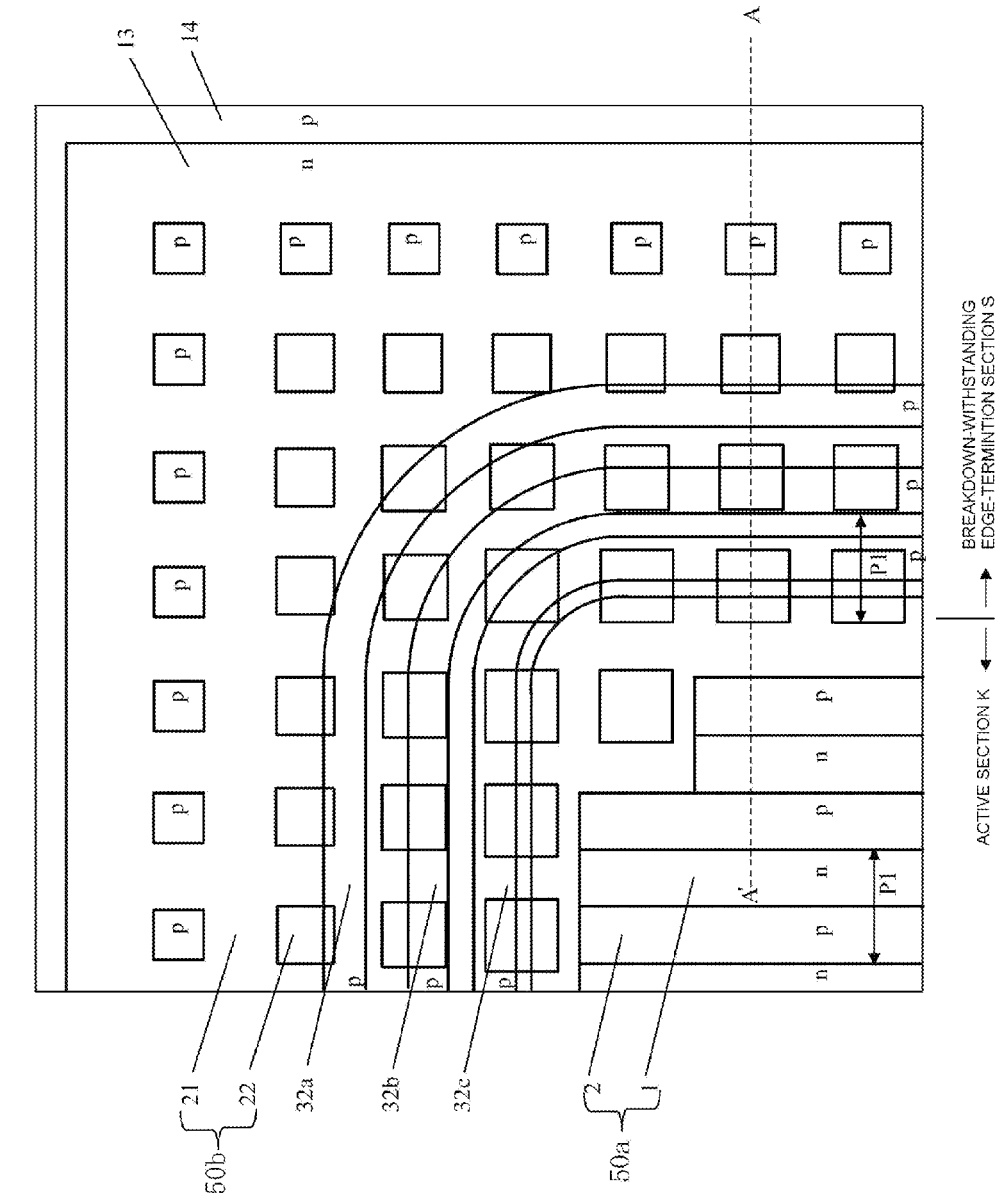
FIG. 1 is a top plan view showing a quarter of the vertical superjunction MOSFET according to a first embodiment of the invention.

FIG. 1 is a top plan view showing a quarter of the vertical superjunction MOSFET according to a first embodiment of the invention. For the sake of ease in understanding, the uppermost surface patterns of alternating-conductivity-type layers 50a and 50b, n-type channel stopper region 13, p-type surface region 14 in the edge area of the edge termination section S, and p-type guard rings 32a, 32b, and 32c in the peripheral area of the active section K are shown. The other surface structure patterns are not shown.

The surface pattern of alternating-conductivity-type layer 50a in an active section K is shaped with stripes. Alternating-conductivity-type layer 50b, arranged in a grid-shaped surface pattern in an edge-termination section S, surrounds alternating-conductivity-type layer 50a in the active section K. The n-type channel stopper region 13 and p-type surface region 14 surround alternating-conductivity-type layer 50b. In alternating-conductivity-type layer 50b in the edge termination section S, p-type semiconductor regions 22 in the n-type semiconductor region 21 are arranged regularly in the planar grid pattern so that a depletion layer may expand uniformly from the active section K side toward the edge termination section S.

Figure 2:
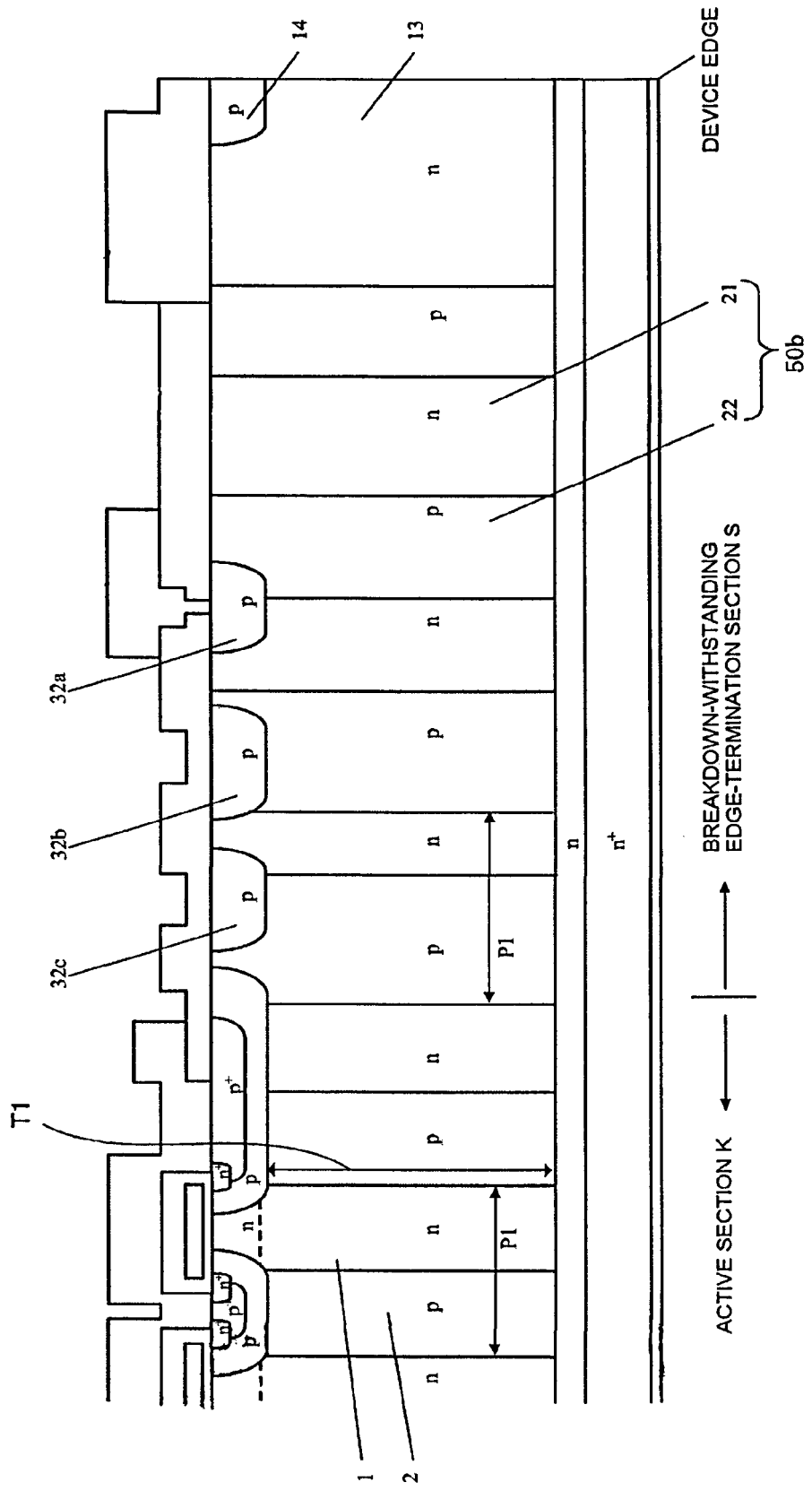
FIG. 2 is a cross sectional view cut along the broken line A-A' in FIG. 1.

FIG. 2 is a cross sectional view cut along the broken line A-A' in FIG. 1. As shown in FIG. 2, p-type semiconductor region 22 in alternating-conductivity-type layer 50b in the edge termination section S becomes narrower toward the edge of the edge termination section. In other words, n-type semiconductor region 21 becomes wider toward the edge of the edge termination section. However, the pitch P1 of the alternate arrangement of the n- and p-type regions in the active section K is the same as the pitch P1 of the edge termination section S.

The vertical superjunction MOSFET according to the first embodiment of the invention exhibits a rated voltage of the 600 V. The preferable examples of the dimensions and impurity concentrations of the main constituent elements are as follows.

The thickness T1 of the drift layer is 44.0 µm. The width of n-type drift region 1 and p-type partition region 2 in the active section K is 6.0 µm. (The pitch P1 of 12.0 µm in the alternating-conductivity-type layers in the active section K is the same as the pitch P1 of the edge termination section S.) The impurity concentration in n-type drift region 1 and p-type partition region 2 in the active section K is $2.0 \times 10^{15}$ cm$^{-3}$. The width of p-type semiconductor region 22 in the edge termination section S is 8.5 µm, 8.3 µm, 8.1 µm, and 7.9 µm from the active section K side to the edge of the edge termination section S. The impurity concentration in p-type semiconductor region 22 and in n-type semiconductor region 21 in the edge termination section S is $2.0 \times 10^{15}$ cm$^{-3}$. The diffusion depth of p-type guard ring regions 32a, 32b, and 32c is 3.0 µm. The surface impurity concentration in p-type guard ring regions 32a, 32b, and 32c is $3.0 \times 10^{17}$ cm$^{-3}$.

According to the first embodiment, the robustness against induced charges for the breakdown voltage is maintained by setting the width of p-type semiconductor region 22 in the edge termination section S to be narrower from the active section K toward the edge of the edge termination section S. The p-type impurity amount becomes smaller gradually by setting p-type semiconductor region 22 to be narrower from the active section K toward the edge of the edge termination section S and the n-type impurity amount becomes larger gradually by setting n-type semiconductor region 21 to be wider from the active section K toward the edge of the edge termination section S to maintain the robustness against induced charges for the breakdown voltage.

The widths of p- and n-type semiconductor region 22 and 21 are set as described above due to the reason described below. The structure described above makes it easier for a depletion layer to expand on the active section side due to positive charges and harder for the depletion layer to expand on the edge side of the edge termination section S due to negative charges.

Figure 3:
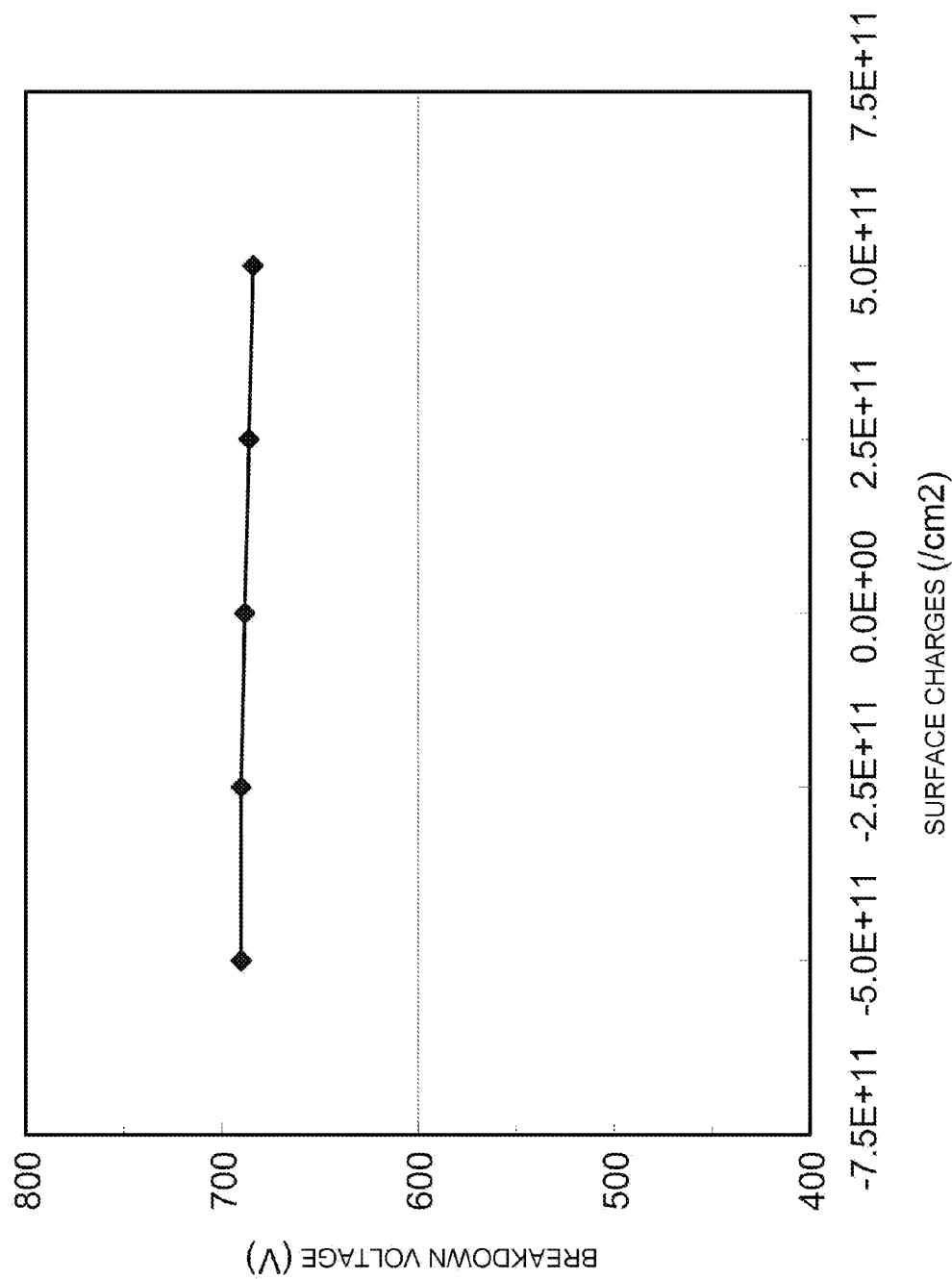
FIG. 3 is a surface charge dependence of the breakdown voltage of the vertical superjunction MOSFET according to the first embodiment.

In FIG. 3, the simulation results of the robustness against induced charges of the vertical superjunction MOSFET according to the first embodiment including four guard rings are described. For example, "7.5E+11" on the horizontal axis of FIG. 3 represents "7.5×10$^{11}$". The results described in FIG. 3 indicate that even when surface charges of ±5×10$^{11}$ cm$^{-2}$ exist, the vertical superjunction MOSFET according to the first embodiment maintains the breakdown voltage equivalent to the breakdown voltage with no charges. By setting the width of p-type semiconductor region 22 to be narrower toward the edge of the edge termination section as described above, a superjunction MOSFET that includes a very reliable and low-cost edge termination section S is obtained.

Second Embodiment

Figure 4:
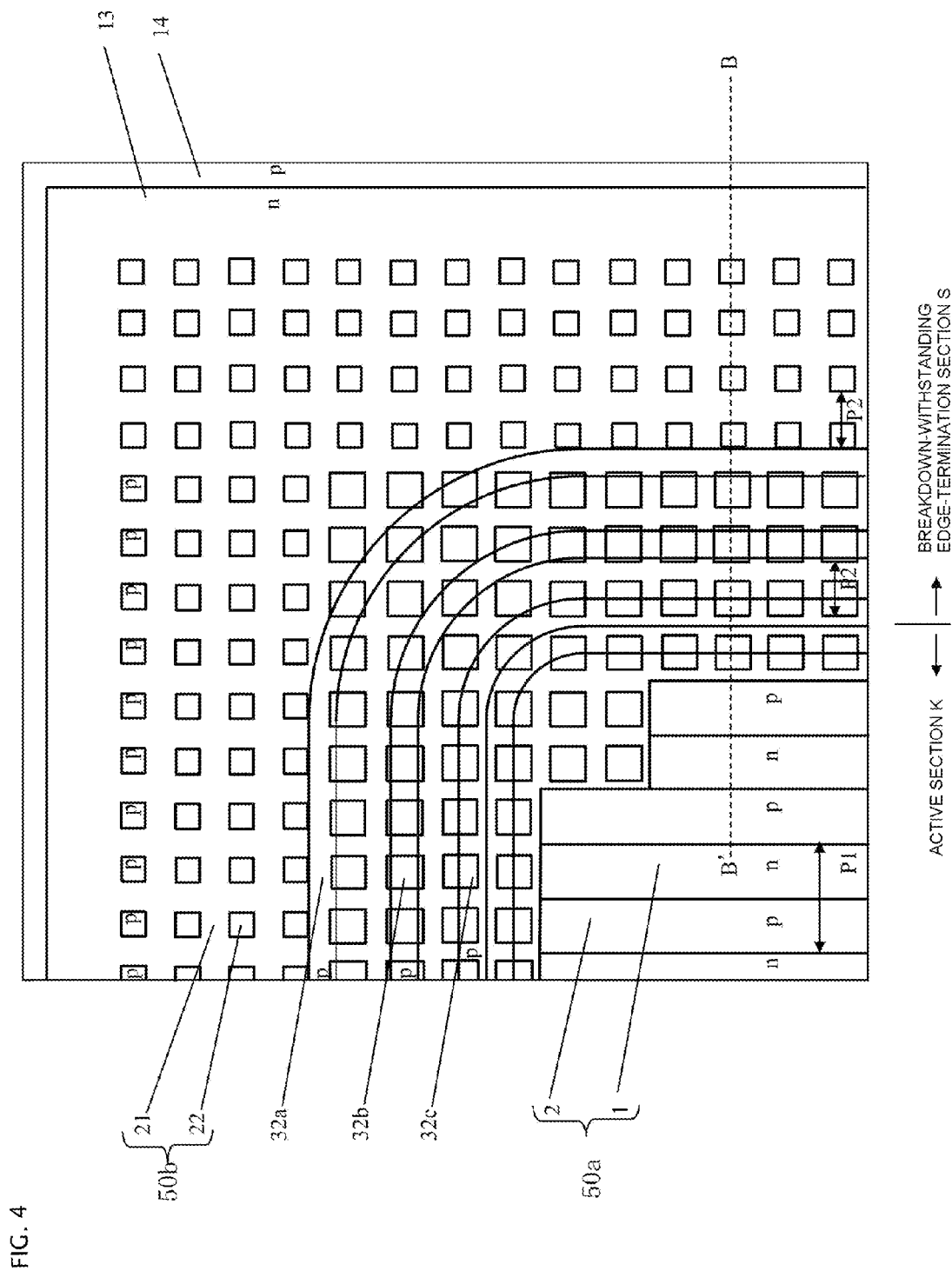
FIG. 4 is a top plan view showing a quarter of the vertical superjunction MOSFET according to a second embodiment of the invention.
Figure 5:
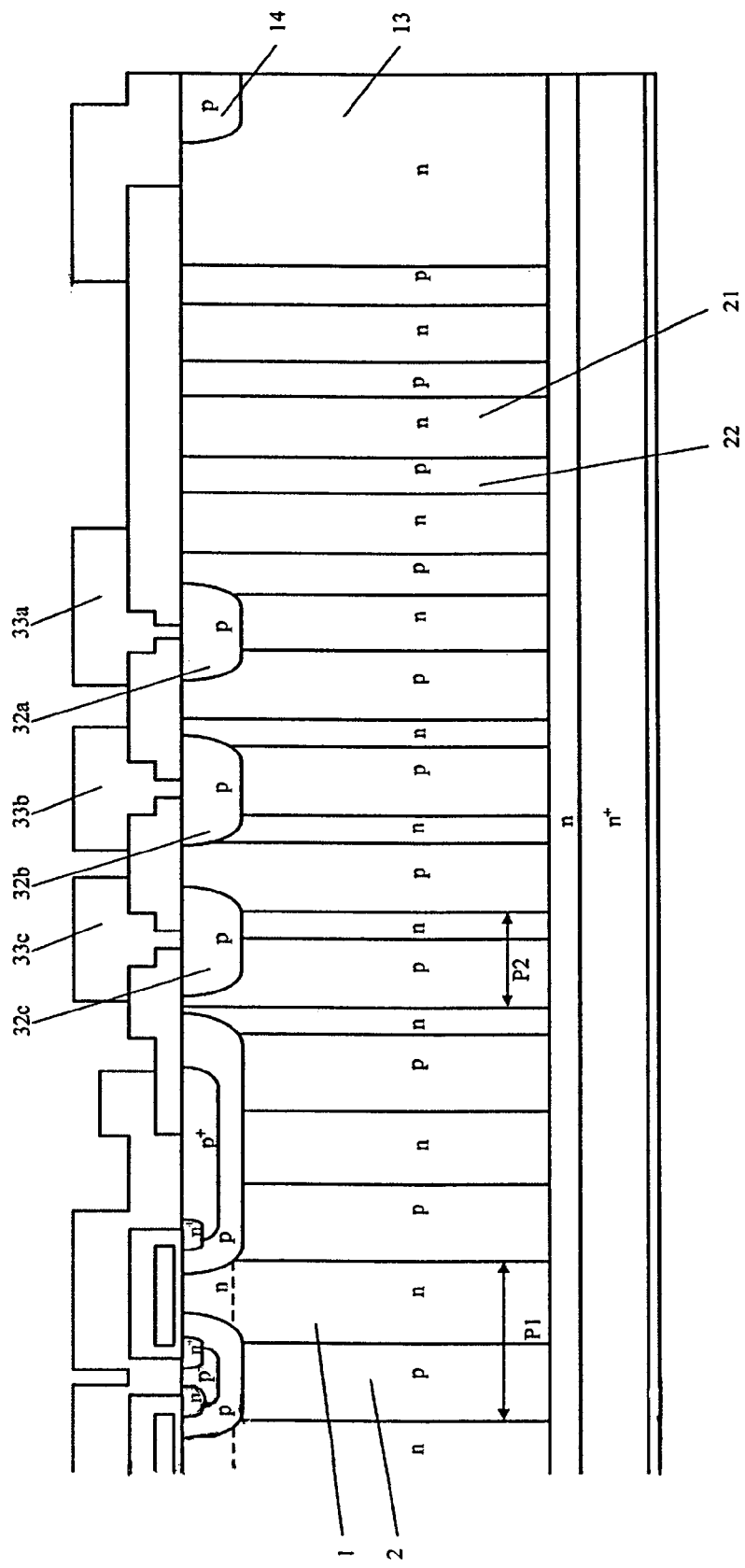
FIG. 5 is a cross sectional view cut along the broken line B-B' in FIG. 4.

Now a vertical superjunction MOSFET according to a second embodiment of the invention will be described below with reference to FIGS. 4 and 5. FIG. 4 is a top plan view showing a quarter of the vertical superjunction MOSFET according to a second embodiment of the invention. FIG. 5 is a cross sectional view cut along the broken line B-B' in FIG. 4.

The vertical superjunction MOSFET according to the second embodiment is different from the vertical superjunction MOSFET according to the first embodiment in that the pitch P2 in alternating-conductivity-type layer 50b in the edge termination section S is smaller than the pitch P1 in alternating-conductivity-type layer 50a in the active section K in the vertical superjunction MOSFET according to the second embodiment. The vertical superjunction MOSFET according to the second embodiment is different from the vertical superjunction MOSFET according to the first embodiment also in that the widths of the regions in alternating-conductivity-type layer 50b do not change gradually but instead change every region group in the vertical superjunction MOSFET according to the second embodiment. In other words, the p-type semiconductor region width becomes narrower than the n-type semiconductor region width in the middle of the edge termination section S.

The vertical superjunction MOSFET according to the second embodiment differs from the vertical superjunction MOSFET according to the first embodiment further in that electrically conductive (metal) field plates 33a, 33b, and 33c are in electrical contact with the surfaces of all the p-type guard rings 32a, 32b, and 32c in the vertical superjunction MOSFET according to the second embodiment.

If the pitch in alternating conductivity type layer 50b becomes smaller from the pitch P1 in alternating conductivity type layer 50a to the pitch P2 as described above, the distance between p-type semiconductor regions 22 becomes narrower and the electric field is liable to relax. Therefore, it is easy to obtain a higher breakdown voltage.

Electrically conductive (metal) field plates 33a, 33b, and 33c in electrical contact with the surfaces of p-type guard rings 32a, 32b, and 32c relax the electric field of p-type guard rings 32a, 32b, and 32c and prevent the depletion layer from expanding. Further, electrically conductive (metal) field plates 33a, 33b, and 33c collect the electric charges caused from the outside. Therefore, electrically conductive (metal) field plates 33a, 33b, and 33c suppress the breakdown voltage variations and improve the robustness against induced charges for the breakdown voltage. Since the p-type semiconductor region 22 width becomes narrower, although stepwise, from the active section K side toward the edge of the edge termination section S, the vertical superjunction MOSFET according to the second embodiment exhibits the same effects which the vertical superjunction MOSFET according to the first embodiment exhibits.

Third Embodiment

Figure 6:
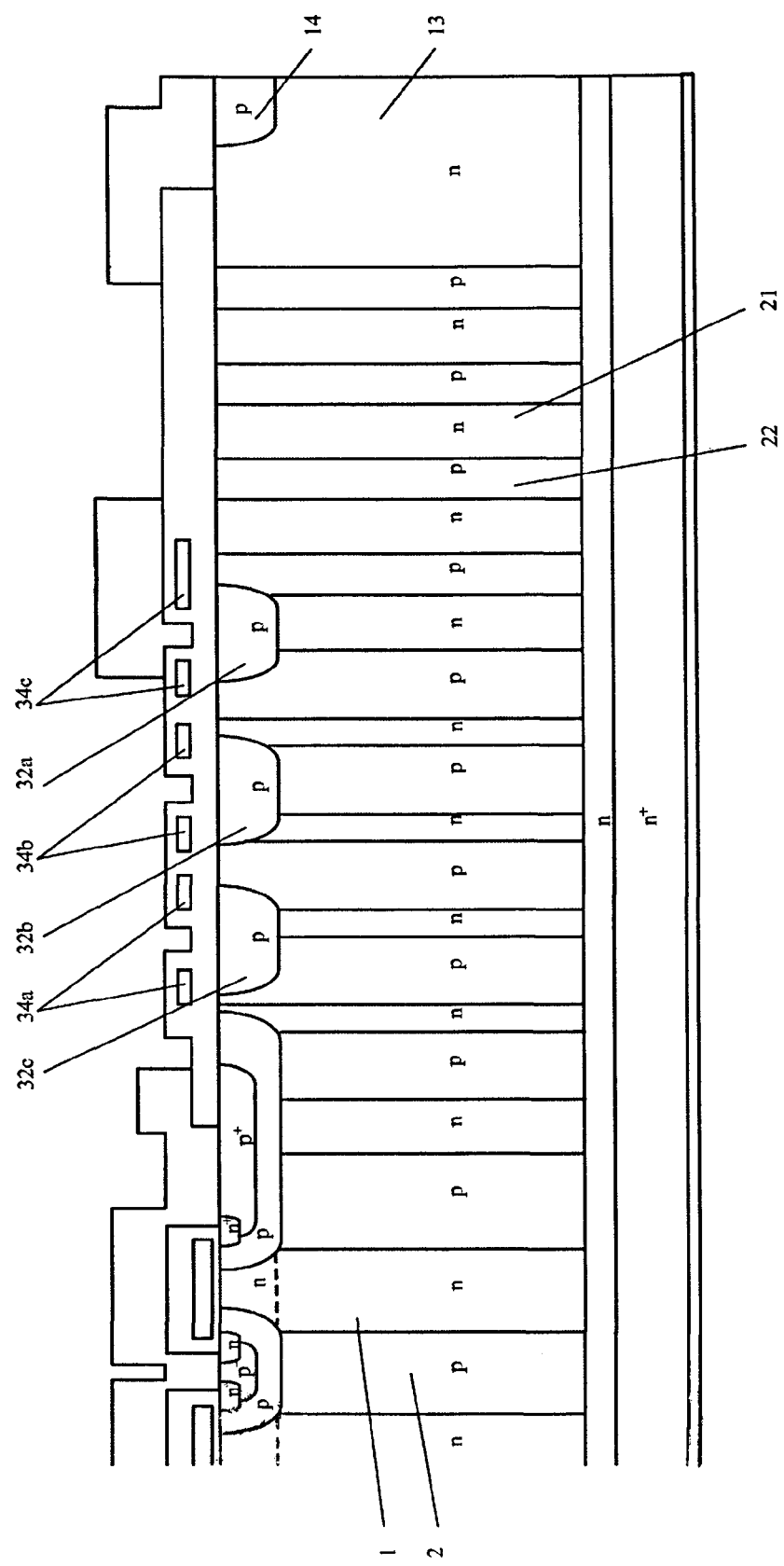
FIG. 6 is the cross sectional view of a vertical superjunction MOSFET according to a third embodiment of the invention.

Now a vertical superjunction MOSFET according to a third embodiment of the invention will be described below with reference to FIG. 6. FIG. 6 is the cross sectional view of a vertical superjunction MOSFET according to a third embodiment of the invention.

The vertical superjunction MOSFET according to the third embodiment is different from the vertical superjunction MOSFET according to the second embodiment in that the vertical superjunction MOSFET according the third embodiment includes polysilicon field plates 34a, 34b, and 34c, in stead of metal field plate 33a, 33b, and 33c, in electrical contact with guard rings 32a, 32b, and 32c. For the patterning of polysilicon, a dry etching technique such as reactive ion etching (RIE) is employed. Since the dry etching facilitates improving the dimensional accuracy, the initial breakdown voltage and the robustness against induced charges for breakdown voltage are stabilized effectively.

According to the first through third embodiments of the invention, an alternating-conductivity-type layer, in which the p-type semiconductor region width becomes narrower from the active section side toward the edge of the edge termination section, is arranged in the edge-termination section that facilitates improving the tradeoff relationship between the on-resistance and the breakdown voltage greatly. Therefore, the superjunction MOSFET according to the invention includes a low-cost edge-termination section that facilitates simplifying the manufacturing process, and suppressing the breakdown voltage variations due to induced charges.

Thus, a superjunction semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2010-250,427, filed on Nov. 9, 2010. The disclosure of the priority application in its entirety, including the drawings, claims, and the specification thereof, is incorporated herein by reference.

What is claimed is:

1. A semiconductor device comprising:
   a heavily doped semiconductor substrate of a first conductivity type;
   a first alternating-conductivity-type layer comprising a column-shaped or a layer-shaped first semiconductor region of the first conductivity type and a column-shaped or a layer-shaped second semiconductor region of a second conductivity type, the first and second semiconductor regions adjoining each other and repeating in parallel to a surface of the semiconductor substrate in order to form a pn-junction, wherein the pn-junctions extend perpendicularly to the surface of the semiconductor substrate and wherein the first alternating-conductivity-type layer is a drift layer that makes a current flow in an ON-state of the semiconductor device and sustains a voltage in an OFF-state of the semiconductor device;

a surface structure on a surface side of the first alternating-conductivity-type layer, the surface structure constituting an active section that makes the current flow;

an edge-termination section surrounding the active section;

a second alternating-conductivity-type layer in the edge-termination section, the second alternating-conductivity-type layer comprising a column-shaped fourth semiconductor region of the second conductivity type in a third semiconductor region of the first conductivity type, the third and fourth semiconductor regions adjoining each other and repeating in parallel to the surface of the semiconductor substrate to form a pn-junction, wherein the pn-junctions extend perpendicularly to the surface of the semiconductor substrate;

wherein a width of the fourth semiconductor region in the second alternating-conductivity-type layer becomes narrower at a predetermined rate from an edge on a side of the active section toward an edge of the edge termination section.

2. The semiconductor device according to claim 1, further comprising guard rings in a surface portion of the second alternating-conductivity-type layer, the guard rings being spaced apart from each other.

3. The semiconductor device according to claim 1, further comprising guard rings and electrically conductive field plates on the guard rings, the field plates being in electrical contact with the guard rings.

4. The semiconductor device according to claim 1, wherein the pitch of the alternating first and second type regions in the active section is the same as the pitch of the third and fourth semiconductor regions.

* * * * *